(12) United States Patent
Hirotsuru et al.

(10) Patent No.: US 8,883,564 B2
(45) Date of Patent: Nov. 11, 2014

(54) SUBSTRATE COMPRISING ALUMINUM/GRAPHITE COMPOSITE, HEAT DISSIPATION PART COMPRISING SAME, AND LED LUMINESCENT MEMBER

(75) Inventors: Hideki Hirotsuru, Omuta (JP); Satoshi Higuma, Omuta (JP); Shinya Narita, Omuta (JP); Yoshihiko Tsujimura, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 327 days.

(21) Appl. No.: 13/148,977

(22) PCT Filed: Feb. 8, 2010

(86) PCT No.: PCT/JP2010/051777
§ 371 (c)(1),
(2), (4) Date: Aug. 11, 2011

(87) PCT Pub. No.: WO2010/092923
PCT Pub. Date: Aug. 19, 2010

(65) Prior Publication Data
US 2011/0316038 A1 Dec. 29, 2011

(30) Foreign Application Priority Data

Feb. 12, 2009 (JP) ................................. 2009-029866

(51) Int. Cl.
*H01L 33/64* (2010.01)
*C04B 41/88* (2006.01)
(Continued)

(52) U.S. Cl.
CPC *C04B 41/88* (2013.01); *H05K 1/05* (2013.01); *C04B 41/5155* (2013.01); *H01L 23/3735*
(Continued)

(58) Field of Classification Search
CPC combination set(s) only.
See application file for complete search history.

(56) References Cited

U.S. PATENT DOCUMENTS 6,447,894 B1 9/2002 Hirotsuru et al.
6,649,265 B1 11/2003 Kawamura et al.
(Continued)

FOREIGN PATENT DOCUMENTS

JP 5 337630 12/1993
JP 2000 158318 6/2000
(Continued)

OTHER PUBLICATIONS

"Density of Various Solids", CRC Handbook of Chemistry and Physics, 94$^{th}$ Edition, section 15, p. 15-39 (2013-2014).*

(Continued)

*Primary Examiner* — Johannes P Mondt
(74) *Attorney, Agent, or Firm* — Oblon, Spivak, McClelland, Maier & Neustadt, L.L.P.

(57) ABSTRACT

A process for producing a substrate, which comprises processing an aluminum/graphite composite into plates having a thickness of 0.5-3 mm using a multi-wire saw under the following conditions (1) to (4): (1) the wires have abrasive grains bonded thereto which are one or more substances selected from diamond, C—BN, silicon carbide, and alumina and have an average particle diameter of 10-100 μm; (2) the wires have a diameter of 0.1-0.3 mm; (3) the wires are run at a rate of 100-700 m/min; and (4) the composite is cut at a rate of 0.1-2 mm/min. The aluminum/graphite composite has a surface roughness (Ra) of 0.1-3 μm, a thermal conductivity at 25° C. of 150-300 W/mK, a ratio of the maximum to the minimum value of thermal conductivity in three perpendicular directions of 1-1.3, a coefficient of thermal expansion at 25-150° C. of $4 \times 10^6$ to $7.5 \times 10^{-6}$/K, a ratio of the maximum to the minimum value of coefficient of thermal expansion in three perpendicular directions of 1-1.3, and a three-point bending strength of 50-150 MPa.

10 Claims, 1 Drawing Sheet

(51) Int. Cl.
*H05K 1/05* (2006.01)
*C04B 41/51* (2006.01)
*H01L 23/373* (2006.01)
*H01L 23/14* (2006.01)
*C04B 41/00* (2006.01)
*B22F 3/26* (2006.01)
*C04B 111/00* (2006.01)

(52) U.S. Cl.
CPC .......... (2013.01); *H05K 2201/0323* (2013.01); *H01L 23/142* (2013.01); *H01L 23/373* (2013.01); *H01L 33/641* (2013.01); *C04B 2111/00844* (2013.01); *C04B 41/009* (2013.01); *B22F 3/26* (2013.01)
USPC ...... 438/113; 438/496; 257/99; 257/E33.075; 428/208; 428/209; 83/13

(56) References Cited

U.S. PATENT DOCUMENTS

| 6,933,531 | B1 | 8/2005 | Ishikawa et al. |
|---|---|---|---|
| 2004/0241447 | A1 | 12/2004 | Fukushima |
| 2006/0075687 | A1* | 4/2006 | Tsuruta et al. .................. 51/307 |
| 2007/0132127 | A1 | 6/2007 | Fukushima |
| 2008/0038535 | A1 | 2/2008 | Fukushima |
| 2009/0080189 | A1* | 3/2009 | Wegner ......................... 362/235 |

FOREIGN PATENT DOCUMENTS

| JP | 2001 58255 | 3/2001 |
|---|---|---|
| JP | 2001 339022 | 12/2001 |
| JP | 3 468 358 | 9/2003 |
| JP | 2005 2470 | 1/2005 |
| JP | 3 673 436 | 4/2005 |
| JP | 2005 117006 | 4/2005 |

OTHER PUBLICATIONS

International Search Report issued Mar. 23, 2010 in PCT/JP10/51777 filed Feb. 8, 2010.

* cited by examiner excelling in heat dissipation properties and reliability, thereby arriving at the present invention.

SUBSTRATE COMPRISING ALUMINUM/GRAPHITE COMPOSITE, HEAT DISSIPATION PART COMPRISING SAME, AND LED LUMINESCENT MEMBER

This application is a National Stage of PCT/JP10/051777 filed Feb. 8, 2010 and claims the benefit of JP 2009-029866 filed Feb. 12, 2009.

TECHNICAL FIELD

The present invention relates to a substrate composed of an aluminum-graphite composite, a heat dissipating component using same, and an LED light-emitting member.

BACKGROUND ART

In recent years, there has been much interest in light-emitting diodes (hereinafter referred to as LEDs) as illumination and light generating means capable of being made lightweight, thin and with low power consumption. LED devices are devices that emit light when a forward current is passed through the pn junction of a semiconductor, produced using III-V semiconductor crystals such as GaAs and GaN. Progress in techniques of semiconductor epitaxial growth and light-emitting device processing has resulted in development of LEDs of exceptional conversion efficiency, that are widely used in various fields.

LED devices are composed of a p-type layer and an n-type layer formed by epitaxial growth of III-V semiconductor crystals on a monocrystalline growth substrate, and an optically active layer sandwiched in between. Generally, LED light-emitting devices are formed by epitaxially growing a III-V semiconductor crystal such as GaN on a growth substrate such as monocrystalline sapphire, then forming electrodes (Patent Document 1).

Recent years have seen rapid advances in the emission efficiency of LED devices, and the higher luminance of LEDs has been accompanied by increased heat generation. For this reason, the reliability of LEDs can be reduced in the absence of adequate heat dissipation measures. Specifically, increases in LED device temperature can result in problems such as reduced luminance and shorter device lifespan. Therefore, metal materials of high thermal conductivity such as copper and aluminum are used for the substrate portions where LEDs are mounted, in order to increase the heat dissipating ability of LED packages. If the substrate alone provides inadequate heat dissipation, metallic heat sinks are sometimes further used as heat dissipation measures.

In accordance with the trend toward application of LED devices to illumination applications, LEDs are becoming increasingly larger and more powerful. While LED devices are generally used by bonding them to substrates by soldering or the like, differences in thermal expansion between the LED devices and substrate materials can lead to stresses generated at the junction layer, which in the worst case can result in destruction of the LED devices or extremely reduced reliability.

In order to cope with the increased heat generation due to the increased power and size of LED chips, metal matrix composites formed as a composite of ceramic particles and metallic aluminum are known as materials having high thermal conductivity and low thermal expansion coefficient (Patent Document 2). For example, a metal matrix composite formed as a composite of aluminum and silicon carbide satisfies the above-described properties, but the material is difficult to work with and is rather expensive for use as a substrate for LEDs. For this reason, metal matrix composites formed as a composite of aluminum with graphite have been considered as metal matrix composites that are relatively easily worked (Patent Document 3).

Metal matrix composites of aluminum and graphite were initially developed for the purpose of forming sliding elements. They are being studied for the possibility of improving their properties by infiltrating the aluminum alloy with graphite materials at high temperatures and high pressures (Patent Document 4).

Patent Document 1: JP 2005-117006 A
Patent Document 2: JP 3468358 B
Patent Document 3: JP 3673436 B
Patent Document 4: JP H5-337630 A

SUMMARY OF THE INVENTION

In order to improve the thermal conductivity properties of an aluminum graphite composite, it is effective to use a coke-type graphite material of high crystallinity as the graphite material. However, coke-type graphite materials are strongly anisotropic, so aluminum-graphite composites obtained by forming composites with aluminum also have anisotropic properties. In substrate materials for LED light emitting elements, their uniformity as elements is important as well as the properties such as thermal conductivity and thermal expansion. When using extremely anisotropic materials, warping can occur, and in the worst case, the LED devices can be destroyed.

Aluminum-graphite composites excelling in properties such as thermal conductivity can be suitably produced by squeeze casting. However, due to the high cost of the materials used in squeeze casting, the LED light emitting elements can become expensive when using aluminum-graphite composites produced normally by squeeze casting as the substrates in LED light emitting elements.

In LED light emitting elements, the heat dissipation measures of the light emitting elements overall are very important in addition to the substrate materials used. For this reason, in addition to the need to use substrate materials excelling in heat dissipation properties, the properties and thickness of the insulation materials used in the circuit portions on which the LEDs are mounted must be appropriate in order to obtain suitable properties as an LED light emitting element.

The present invention was made in view of the above considerations, and has the purpose of offering an LED light emitting element excelling in heat dissipation properties and reliability, and heat dissipating components constituting the same.

Means for Solving the Problem

The present inventors performed diligent research toward achieving the above-described purpose, as a result of which they discovered that an aluminum-graphite composite excelling in thermal conductivity, thermal expansion and strength properties can be efficiently produced by squeeze casting an isotropic graphite material in the form of a rectangular parallelepiped to form a composite with an aluminum alloy, and a substrate consisting of a plate-shaped aluminum-graphite composite can be efficiently obtained by reducing material losses due to the cutting reserve (cutting width) by appropriately adjusting the processing conditions with a multi-wire saw. Furthermore, they discovered that an LED light emitting element excelling in heat dissipation properties and reliability can be obtained by appropriately changing the substrate shape, insulation material and circuit arrangement, thereby completing the present invention. For the purposes of the present specification, "substrate" shall refer to the substrate before attachment of copper foil and electronic components.

In other words, the present invention relates to a method of producing a substrate by working an aluminum-graphite composite; the aluminum-graphite composite having a surface roughness (Ra) of 0.1 to 3 μm, a thermal conductivity of 150 to 300 W/mK at a temperature of 25° C., a maximum/minimum ratio of 1 to 1.3 for thermal conductivity in three orthogonal directions, a coefficient of thermal expansion of $4 \times 10^{-6}$ to $7.5 \times 10^{-6}$/K at a temperature of 25° C. to 150° C., a maximum/minimum ratio of 1 to 1.3 for coefficient of thermal expansion in three orthogonal directions, and a three-point bending strength of 50 to 150 MPa; using a multi-wire saw, under the following conditions (1) to (4):
(1) the bonded abrasive grains being of at least one type chosen from among diamond, C—BN, silicon carbide and alumina, and having an average grain size of 10 to 100 μm;
(2) the wire diameter being 0.1 to 0.3 mm;
(3) the wire delivery rate being 100 to 700 m/min; and
(4) the cutting rate being 0.1 to 2 mm/min;
forming plates of thickness 0.5 to 3 mm.

Furthermore, the present invention relates to a heat dissipating component having a substrate produced by the above-described method. The heat dissipating components may have one main surface of the substrate worked into the shape of a fin, have holes formed in the substrate, have a plating layer formed on a surface of the substrate, have a metal circuit formed on one main surface and/or both main surfaces of the substrate interposed by an insulation layer, or have a metal circuit formed on one main surface and/or both main surfaces of the substrate interposed by an active metal bonding agent layer.

Additionally, the present invention relates to a light emitting member having an LED-bearing chip and/or an LED package mounted on one main surface and/or both main surfaces of a substrate on the heat dissipation component, directly and/or on an insulation layer and/or an active metal bonding agent layer and/or a metal circuit formed on said surfaces Additionally, the present invention also concerns a method for producing an aluminum-graphite composite, the production method comprising pressurized infiltration of an isotropic graphite material in the form of a rectangular parallelepiped with each edge having a length of 100 to 500 mm, having, as raw material, a coke-type graphite with a thermal conductivity of 100 to 200 W/mK at a temperature of 25° C., a maximum/minimum ratio of 1 to 1.3 for thermal conductivity in three orthogonal directions, a coefficient of thermal expansion of $2 \times 10^{-6}$ to $5 \times 10^{-6}$/K at a temperature of 25° C. to 150° C., a maximum/minimum ratio of 1 to 1.3 for coefficient of thermal expansion in three orthogonal directions, and a porosity of 10 to 20 vol %, with an aluminum alloy containing 3 to 20 mass % of silicon, by squeeze casting at a pressure of at least 20 MPa, resulting in infiltration by the aluminum alloy of at least 70% of the pores in the isotropic graphite material.

DESCRIPTION OF THE REFERENCE NUMBERS

Figure 1:
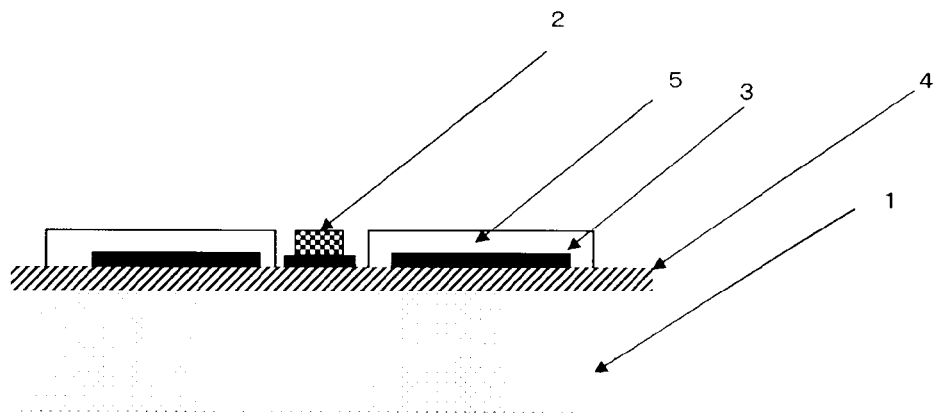
FIG. 1 A structural view of an LED light emitting element showing an embodiment of the present invention.

1 substrate
2 LED chip
3 metal circuit
4 insulation layer
5 solder resist
6 interlayer connection bump
7 active metal junction layer

MODES FOR CARRYING OUT THE INVENTION

Herebelow, embodiments of the LED light emitting element and substrate consisting of an aluminum-graphite composite used therein according to the present invention shall be explained.

The graphite material constituting the substrate 1 consisting of an aluminum-graphite composite according to the present invention is an isotropic graphite material in the form of a rectangular parallelepiped with each edge having a length of 100 to 500 mm, having, as raw material, a coke-type graphite with a thermal conductivity of 100 to 200 W/mK at a temperature of 25° C., a maximum/minimum ratio of 1 to 1.3 for thermal conductivity in three orthogonal directions, a coefficient of thermal expansion of $2 \times 10^{-6}$ to $5 \times 10^{-6}$/K at a temperature of 25° C. to 150° C., a maximum/minimum ratio of 1 to 1.3 for coefficient of thermal expansion in three orthogonal directions, and a porosity of 10 to 20 vol %. For the purposes of the present specification, "three orthogonal directions" shall refer to the three directions (length direction, width direction, height direction) orthogonal to the main surfaces of the isotropic graphite material in the form of a rectangular parallelepiped.

The isotropic graphite material is pressure infiltrated with an aluminum alloy to produce an aluminum-graphite composite. By using an isotropic graphite material having the above properties, an aluminum-graphite composite having the properties required of a substrate material for LED light emitting elements can be obtained. As for the method for compositing the isotropic graphite material and the aluminum alloy, when considering the properties of the resulting aluminum-graphite composite, a squeeze casting method involving pressure infiltration after heating the isotropic graphite material and aluminum alloy to at least the melting point of the aluminum alloy is preferable.

The thermal conductivity of the isotropic graphite material at 25° C. is 100 to 200 W/mK, and the maximum/minimum ratio for thermal conductivity in three orthogonal directions is 1 to 1.3. If the thermal conductivity of the isotropic graphite material is less than 100 W/mK, the resulting aluminum-graphite composite will have low thermal conductivity, so the heat dissipation will be insufficient when used as a substrate material for LED light emitting elements. As for the upper limit, there are no restrictions based on the properties, but if the thermal conductivity exceeds 200 W/mK, the material itself becomes prohibitively expensive, and the properties become strongly anisotropic. Additionally, if the maximum/minimum ratio for thermal conductivity in three orthogonal directions exceeds 1.3, the anisotropy of the heat dissipation properties can become too great, so that when used as a substrate material for LED light emitting elements, there may be problems such as transitory increases in the temperature of the LED device.

The coefficient of thermal expansion of the isotropic graphite material at a temperature of 25° C. to 150° C. is $2 \times 10^{-6}$ to $5 \times 10^{6}$/K, and the maximum/minimum ratio for the coefficient of thermal expansion in three orthogonal directions is 1 to 1.3. If the coefficient of thermal expansion of the isotropic graphite material at a temperature of 25° C. to 150° C. is less than $2 \times 10^{-6}$/K or more than $5 \times 10^{-6}$/K, the difference in coefficient of thermal expansion between the resulting aluminum-graphite composite and the LED element may become too large, leading to reduced LED device lifespan, and in some cases, destruction of the LED device. Furthermore, if the maximum/minimum ratio for the coefficient of thermal expansion in three orthogonal directions exceeds 1.3, then the anisotropy of the coefficient of thermal expansion of the aluminum-graphite composite may become too great. As a result, stresses can be applied unevenly to the LED device during emission of the LED device, leading to reduced LED device lifespan, and in some cases, destruction of the LED device.

Furthermore, the isotropic graphite material has a coke-type graphite with a porosity of 10 to 20 vol % as the raw material. When the porosity is less than 10 vol %, the aluminum alloy will not adequately penetrate into the void portions during pressure infiltration by the aluminum alloy, reducing the thermal conductivity of the resulting aluminum-graphite composite. Additionally, when the porosity exceeds 20 vol %, the aluminum alloy content in the resulting aluminum-graphite composite will be high, resulting in a high coefficient of thermal expansion for the aluminum-graphite composite. As for the raw material of the isotropic graphite material, the raw material should be coke for its thermal conductivity, the isotropic graphite material being obtained by hydrostatic pressing followed by graphitization.

In order to provide the finally obtained substrate 1 at a reasonable cost, the subsequent processing steps (specifically the cutting step) must be taken into consideration to most efficiently produce the aluminum-graphite composite. In particular, in pressure infiltration, the efficiency of production of the aluminum-graphite composite is crucial. In order to efficiently perform cutting, a rectangular parallelepiped having edges 100 to 500 mm long is most efficient. In the case of a rectangular parallelepiped having edges less than 100 mm long, the volume of the aluminum-graphite composite that can be obtained with a single compositing step is small, as a result of which the cost per unit volume of the substrate 1 obtained after processing becomes high. On the other hand, if the length of each edge exceeds 500 mm, they can become difficult to handle, the equipment used for compositing and the equipment used for cutting become extremely expensive, and the cost per unit volume of the substrate 1 obtained after the final step is high.

Next, this rectangular parallelepiped-shaped isotropic graphite material is pinched between iron jigs to form a stacking block, then heated at 600 to 750° C. in air or nitrogen, then placed inside a high-pressure vessel, and as quickly as possible in order to prevent drops in the temperature of the stacking block, a melt of aluminum alloy heated to at least the melting point is poured in and at least 20 MPa of pressure is applied to infiltrate the voids in the graphite material with the aluminum alloy, thus resulting in an aluminum-graphite composite. The infiltrated product may be annealed for the purpose of eliminating strain from the infiltration. The jigs used for stacking may be coated with a mold release agent such as graphite or alumina for the purpose of achieving a mold release property.

If the heating temperature of the stacking block is less than 600° C., the aluminum alloy will be inadequately corn posited, resulting in a decrease in properties of the aluminum-graphite composite such as thermal conductivity. On the other hand, if the heating temperature exceeds 750° C., low thermal conductivity aluminum carbide is formed when compositing the aluminum alloy, as a result of which the thermal conductivity of the aluminum-graphite composite will decrease. Furthermore, if the pressure during infiltration is less than 20 MPa, the aluminum alloy will be insufficiently composited, resulting in reduced thermal conductivity of the aluminum-graphite composite. The infiltration pressure is more preferably at least 50 MPa.

The aluminum alloy used for producing the aluminum-graphite composite should preferably contain 3 to 20 mass % of silicon. If the silicon content exceeds 20 mass %, the thermal conductivity of the aluminum alloy will decrease. On the other than, if the silicon content is less than 3 mass %, the melted aluminum alloy will flow poorly, as a result of which the aluminum alloy cannot sufficiently penetrate into the voids in the isotropic graphite material during infiltration. As for the metal components in the aluminum alloy other than aluminum and silicon, there are no particular restrictions as long as they are within a range not resulting in extreme changes in the properties, and magnesium can be contained in amounts of up to about 3 mass %.

One method of efficiently working the rectangular parallelepiped-shaped aluminum-graphite composite into substrates 1 is to perform cutting by a multi-wire saw. While aluminum-graphite composites consisting of graphite materials with voids infiltrated with an aluminum alloy are materials that excel in workability, the material itself is expensive compared to metal materials such as copper and aluminum. For this reason, in order to more cheaply produce substrates 1, it is important to efficiently produce aluminum-graphite composites and work them into the form of plates. Specifically, it was discovered that by optimizing the processing conditions in the multi-wire saw, the loss of material due to the cutting reserve (cutting width) can be greatly reduced so as to perform the cutting process efficiently, and sufficient surface precision can be secured for use as a substrate material. For the purposes of the present specification, "plate-shaped" refers generally to any shape having two parallel or roughly parallel main surfaces. The main surfaces may be of any shape, whether discoid, elliptical or triangular.

While processes of cutting with a multi-wire saw can be largely classified into those of free abrasive grain type and fixed abrasive grain type, since the work object is an aluminum-graphite composite which has high hardness, the fixed abrasive grain type is preferably used for efficient cutting. The wires of the multi-wire saw used to cut the rectangular parallelepiped-shaped aluminum-graphite composite are wires formed by bonding one or more types of abrasive grains chosen from among diamond, C—BN, silicon carbide and alumina having an average particle size of 10 to 100 μm as the abrasive grains. Due to their processing efficiency, wires having electrodeposited diamond abrasive grains are most preferred. If the average grain size of the abrasive grains is less than 10 μm, the workability is reduced, so efficient cutting is not possible, or the work surface may become uneven due to vibrations of the wire during processing. On the other hand, if the average grain size of the abrasive grains exceeds 100 μm, the planar precision of the product can be reduced, making the surface too rough. Additionally, if the average grain size of the abrasive grains exceeds 100 μm, the wire diameter will become very large, making the cost of the wires expensive and increasing loss of material due to the cutting reserve.

The wire diameter of the multi-wire saw is preferably 0.1 to 0.3 mm, and more preferably 0.15 to 0.25 mm. If the wire diameter is less than 0.1 mm, the granularity of the abrasive grains that can be bonded will be so small that the processing speed will fall. If the wire diameter exceeds 0.3 mm, the wire will become expensive, and the loss of material due to the cutting reserve will increase.

The processing conditions for the multi-wire saw are a wire delivery rate of 100 to 700 m/sec and a cutting rate of 0.1 to 2 mm/min. If the wire delivery rate is less than 100 m/min, the processing rate is not sufficient, leading to high processing costs. On the other hand, if the wire delivery rate exceeds 700 m/min, the processing rate is sufficient, but the expensive wires will be rapidly worn. Additionally, if the cutting rate of the wires is less than 0.1 mm/min, then the processing rate is not sufficient, leading to high processing costs, and conversely, if the cutting rate exceeds 2 mm/min, the cutting surface will become uneven and the wires may break.

The thickness of the substrates 1 obtained by cutting the aluminum-graphite composite with a multi-wire saw is preferably 0.5 to 3 mm, and more preferably 1 to 2 mm. If the thickness of the aluminum-graphite composite 1 is less than 0.5 mm, the heat capacity will be insufficient when used as a substrate material for mounting LED devices, resulting in sudden increases in the temperature of the LED devices. On the other hand, if the thickness exceeds 3 mm, the thermal resistance in the thickness direction will increase, causing the temperature of the LED devices to rise.

In the aluminum-graphite composite, at least 70% of the voids in the isotropic graphite material are infiltrated with the aluminum alloy. If the number of voids not infiltrated with aluminum alloy exceeds 30%, the thermal conductivity of the aluminum-graphite composite will fall.

In the aluminum-graphite composite, the thermal conductivity at a temperature of 25° C. is 150 to 300 W/mK, and the maximum/minimum ratio for thermal conductivity 25° C. is less than 150 W/mK, the heat dissipation will be insufficient when used as a substrate material for LED light emitting elements. As for the upper limit, there are no restrictions based on the properties, but the material itself can become prohibitively expensive, and the properties can become strongly anisotropic. Additionally, if the maximum/minimum ratio for thermal conductivity in three orthogonal directions exceeds 1.3, the anisotropy of the heat dissipation properties can become too great, so that when used as a substrate material for LED light emitting elements, there may be problems such as transitory increases in the temperature of the LED device.

The coefficient of thermal expansion of the aluminum-graphite composite at a temperature of 25° C. to 150° C. is $4 \times 10^6$ to $7.5 \times 10^{-6}$/K, and the maximum/minimum ratio for the coefficient of thermal expansion in three orthogonal directions is 1 to 1.3. If the coefficient of thermal expansion of the isotropic graphite material at a temperature of 25° C. to 150° C. is less than $4 \times 10^{-6}$/K or more than $7.5 \times 10^{-6}$/K, the difference in coefficient of thermal expansion between the resulting aluminum-graphite composite and the LED element may become too large, leading to reduced LED device lifespan, and in some cases, destruction of the LED device. Furthermore, if the maximum/minimum ratio for the coefficient of thermal expansion in three orthogonal directions at 25° C. to 150° C. exceeds 1.3, then the anisotropy of the coefficient of thermal expansion of the aluminum-graphite composite may become too great. As a result, stresses can be applied unevenly to the LED device during emission of the LED device, leading to reduced LED device lifespan, and in some cases, destruction of the LED device.

The aluminum-graphite composite has a three-point bending strength of 50 to 150 MPa. If the three-point bending strength is less than 50 MPa, cracks may occur during handling. In that case, since the aluminum-graphite composite is an electrically conductive material, this may lead to insulation defects or the like. Additionally, when a substrate 1 consisting of an aluminum-graphite composite is screwed onto a heat sink or casing, cracking may occur during mounting. As for the upper limit of the three-point bending strength, there are no restrictions due to the properties, but in order to make the aluminum-graphite composite so strong as to have a three-point bending strength exceeding 150 MPa, other ceramic grains must be added or mosaic graphite or the like having poor thermal conductivity must be added. In that case, the thermal conductivity of the aluminum-graphite composite will be reduced. Furthermore, when LED light emitting elements are used for illumination of mobile devices such as automobiles, the strength must be sufficient to prevent cracking and breaking due to vibrations and the like.

The surface roughness (Ra) of the aluminum-graphite composite should be 0.1 to 3 μm, preferably 0.1 to 2 μm. If the surface roughness (Ra) exceeds 3 μm, sufficient contact strength cannot be obtained for bonding the insulation layer 4 and the LED device when used as a substrate material for LED light emitting elements, and furthermore, the low thermal conductivity insulation layer can become too thick, reducing heat dissipation. On the other hand, as for the lower limits of the surface roughness (Ra), there are no restrictions due to the properties, but in order to make Ra less than 0.1 μm, the cutting efficiency of the rectangular parallelepiped-shaped aluminum-graphite composite will be reduced, and the processing costs will become prohibitive expensive. While the desired surface roughness can be achieved on the cutting surface, it could also be adjusted to a desired surface roughness by polishing or the like as needed.

When using a substrate 1 mounted with an LED device as an LED light emitting element, it will often be connected via a metallic heat sink or by providing heat dissipating grease or a heat dissipating sheet on the casing or the like for the purposes of heat dissipation. In such a format, the substrate 1 mounted with LED devices is often screwed onto a metallic heat sink or casing in order to secure tight contact with the joined surface. By forming holes in the substrate 1 and screwing the substrate mounted with an LED device into a heat sink or a casing, the contact therebetween can be improved and the reliability of the attachment portion increased. Since aluminum-graphite composites excel in workability, the holes can be formed using a normal drill or the like. Additionally, holes can be formed by laser processing, water-jet processing, or even by pressing. The shape of the holes may be of any shape enabling screw fastening, and they may be U-shaped.

In order to improve the heat dissipation of the LED light emitting elements, the substrate 1 consisting of a plate-shaped aluminum-graphite composite should be directly attached to a heat sink mechanism (heat dissipating fins) without the interposition of heat dissipating grease or heat dissipating sheets. Since aluminum-graphite composites excel in workability, a heat sink mechanism can be provided by directly working the non-mounting surface side of the LED device into the form of fins. By making one main surface of the substrate 1 fin-shaped, the heat dissipation properties of the LED light emitting element can be improved, making other heat dissipating elements unnecessary, and enabling the number of components to be reduced and the LED light emitting element to be made more compact. Additionally, since aluminum-graphite composites excel in heat dissipation by radiation, they are suitable materials for forming heat dissipating fins.

An LED light emitting element is a substrate 1 consisting of a plate-shaped aluminum-graphite composite, to which an LED device has been attached. The method of attachment may generally be a high thermal conductivity adhesive or solder. For the purposes of thermal conductivity, direct soldering to the substrate 1 without the interposition of an insulation layer 4 of low thermal conductivity is preferred. However, since aluminum-graphite composites cannot be directly soldered, a plating player must be formed on the surface of the aluminum-graphite composite. The method of formation of the plating layer is not particularly limited, and it may be formed by electrolytic plating or electroless plating. The plating material may be nickel, copper, gold, tin or the like, or a composite thereof. As for the plating thickness, as long as it is within a range enabling close contact between the plating layer and the aluminum-graphite composite forming the substrate, and ensuring solder wettability, it should be as thin as possible, generally 1 to 5 μm, in order to achieve adequate thermal conductivity.

The LED device of the LED light emitting element may be a bare chip or have a packaged structure. Additionally, the portions of contact between the LED device and the heat dissipating components having metal circuits 3 formed on one main surface or both main surfaces of a substrate 1 may or may not be subjected to an electrical insulation treatment. For the purposes of the present specification, "heat dissipating component" shall refer collectively to elements for dissipating heat generated by the LED device, for example, those having metal circuits 3 arbitrarily formed on one main surface or both main surfaces of a substrate 1 consisting of an aluminum-graphite composite.

Figure 3:
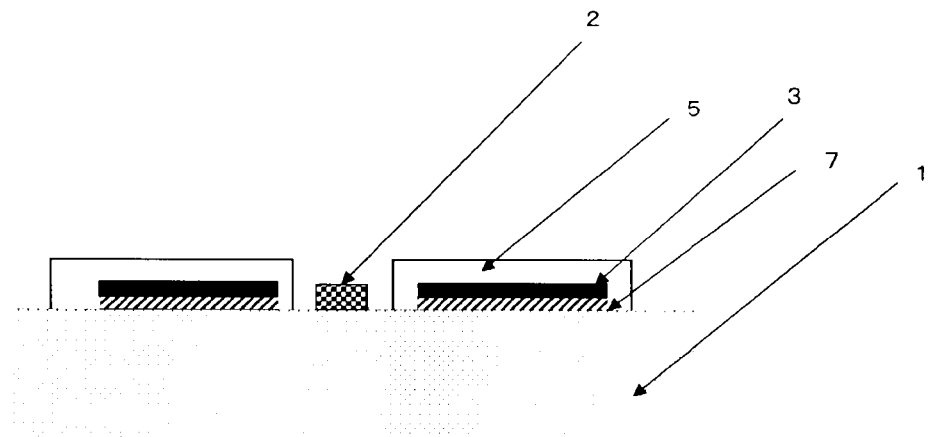
FIG. 3 A structural view of an LED light emitting element showing an embodiment of the present invention.

FIG. 1 and FIG. 3 show an embodiment wherein a portion of contact between the LED device and the heat dissipating component has not been subjected to an electrical insulation treatment. The structure is such that a metal circuit 3 is formed on one main surface or both main surfaces of a substrate 1 consisting of a plate-shaped aluminum-graphite composite with an insulation layer 4 or active metal bonding layer 7 interposed therebetween, and an LED device (LED chip 2) positioned on the surface of the metal circuit 3 or the substrate 1 by direct brazing or the like.

The insulation layer 4 formed on one main surface or both main surfaces of the substrate 1 is a curable resin composition having a heat-resistant resin and an inorganic filler as main components, preferably having a thermal conductivity of at least 1 W/mK after curing. Examples of heat-resistant resins include epoxy resins, silicone resins, polyimide resins and acrylic resins. The proportion of the heat-resistant used should be 10% to 40% by capacity. At less than 10% by capacity, the viscosity of the insulation layer composition rises and the workability is reduced, whereas at more than 40% by capacity, the thermal conductivity of the insulation layer 4 is reduced.

When there is a large difference in coefficient of thermal expansion between the materials of the substrate 1 and the LED device, the storage modulus of the resin composition after curing should preferably be 15000 MPa or less at 300 K. In this case, the curable resin composition may be formed by combining (1) a resin mainly consisting of an epoxy resin, (2) a curing agent having a polyether skeletal structure and having a primary amino group at the terminus of the main chain, and (3) an inorganic filler, thereby resulting in a cured object excelling in stress relaxation, electrical insulation, heat dissipation, heat resistance and moisture resistance. While the epoxy resin may be any generally used epoxy resin such as a bisphenol F type epoxy resin or a bisphenol A type epoxy resin, the balance of stress relaxation and moisture resistance can be further improved by including at least one type chosen from among epoxy resins having a dicyclopentadiene skeletal structure, epoxy resins having a naphthalene skeletal structure, epoxy resins having a biphenyl skeletal structure and epoxy resins having a novolac skeletal structure in an amount of at least 10 mass % of all epoxy resins. While epoxy resins representative of those having a novolac skeletal structure include phenol novolac type epoxy resins and cresol novolac type epoxy resins, epoxy resins having both a novolac skeletal structure and a dicyclopentadiene skeletal structure, a naphthalene skeletal structure or a biphenyl skeletal structure may also be used. The epoxy resin may be an epoxy resin having an above-mentioned skeletal structure used alone. Additionally, while heat-curable resins such as phenol resins and polyimides, and macromolecular resins such as phenoxy resin, acrylic rubber and acrylonitrile-butadiene rubber can be added as other resins mainly consisting of epoxy resins, when considering the balance of stress relaxation, electrical insulation, heat resistance and moisture resistance, the amount of the macromolecular resin to be added should preferably be no more than 30 mass % with respect to the total amount together with the epoxy resin.

The curing agent, which has a polyether skeletal structure and has a primary amino group on the terminus of the main chain, is used to lower the storage modulus of the resin composition after curing. It can be used in conjunction with other curing agents. When used together with an aromatic amine curing agent, the balance of stress relaxation, electrical insulation and moisture resistance can be further improved. Examples of aromatic amine current agents include diaminodiphenylmethane, diaminodiphenylsulfone and metaphenylenediamine. It can also be used together with a curing agent such as phenol novolac resin.

Examples of inorganic fillers include oxide ceramics such as aluminum oxide (alumina), silicon oxide and magnesium oxide, nitride ceramics such as aluminum nitride, silicon nitride and boron nitride, an carbide ceramics. The proportion of inorganic filler in the curable resin composition should be 18% to 27% inorganic filler by volume. Outside this range, the viscosity of the resin composition will rise and the thermal conductivity will be reduced. The inorganic filler should consist of spherical grains having a maximum grain size of 100 μm or less and a minimum grain size of at least 0.05 μm. Furthermore, it should include 50 to 75 mass % of grains with a grain size of 5 to 50 μm, and 25 to 50 mass % of grains with a grain size of 0.2 to 1.5 μm.

The curable resin composition constituting the insulation layer 4 may also use a silane coupler, a titanate coupler, a stabilizer or a curing promoter as needed.

The material of the metal circuit 3 may be copper foil, aluminum foil, copper-aluminum clad foil, or copper-nickel aluminum clad foil.

Examples of techniques for forming a metal circuit 3 on a substrate 1 composed of an aluminum-graphite composite having an insulation layer 4 interposed therebetween include the following. A method of printing a pattern of a curable resin composition slurry constituting the insulation layer 4 on the substrate 1 by screen printing or the like, heating to put in a semi-cured state, applying metal foil thereto, and heating further to a almost completely cured state, or pre-cutting the insulation layer 4 into semi-cured sheets, and integrating with a metal foil by means of a hot press. While there are no particular restrictions on the method of circuit pattern formation, it is desirable to pre-apply a resist ink to predetermined locations on the metal foil, heat or UV-cure, then etch with an etchant such as a mixture of cupric chloride, hydrogen peroxide water and sulfuric acid.

Figure 2:
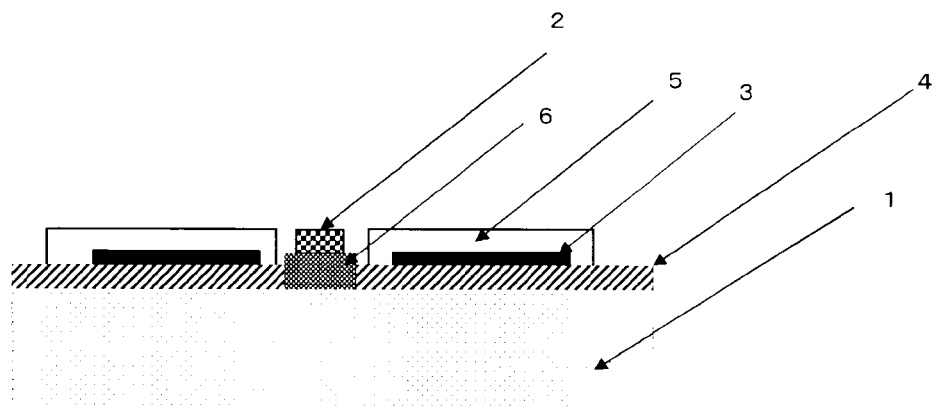
FIG. 2 A structural view of an LED light emitting element showing an embodiment of the present invention.

FIG. 2 shows an embodiment wherein the portion of contact between the LED device and the heat dissipating component has been subjected to an electrical insulation treatment. FIG. 2 shows the structure wherein a metal circuit 3 is formed on one main surface or both main surfaces of the substrate 1 consisting of an aluminum-graphite composite with the insulation layer 4 interposed therebetween, and the layers are connected via an interlayer connection bump 6 below the LED device (LED chip 2).

Alternatively, as shown in FIG. 3, a heat dissipation structure characterized by forming a metal circuit on one main surface and/or both main surfaces of the substrate 1 consisting of an aluminum-graphite composite with the active metal bonding layer 7 interposed therebetween is favorable.

As shown in FIG. 2, the material of the metal circuit 3 and the material of the insulation layer 4 may be the same as in the case shown in FIG. 1. The method of forming an interlayer connection bump on the substrate 1 consisting of an aluminum-graphite composite may be any capable of conductively connecting the metal circuit 3 and the interlayer connection bump 6, examples of which include methods of formation by metal plating, and methods of formation by conductive paste. The method of forming such an insulation layer 4 having an interlayer connection bump 6 may be a method of filling the periphery and top portion of the interlayer connection bump 6 with the composition to form the insulation layer in slurry form, heating to a semi-cured state, then bonding metal foil thereto and further heating to an almost completely cured state, removing the metal circuit above the interlayer connection bump 6 by etching or the like, and removing the insulation layer composition by laser processing or the like, or a method of pre-cutting the insulation layer composition into a sheets in a semi-cured state, integrating with a metal foil by means of a hot press to form a stacking block having a raised portion at a position corresponding to the interlayer connection bump 6 and a metal layer on the surface, and removing the raised portion of the stacking block to expose an interlayer connection bump 6.

With reference to FIG. 3, the material of the metal circuit 3 may be Al alone, or a single Al alloy such as Al—Si alloy, Al—Si—Mg alloy or Al—Mg—Mn.

As for the material constituting the active metal bonding layer 7, an Al—Si or Al—Ge alloy or Al—Cu—Mg alloy may be used, but an Al—Cu—Mg alloy is especially preferred. First, Al—Cu—Mg alloys have a wider tolerance for bonding conditions with ceramic materials than do Al—Si type, Al—Ge type, Al—Si—Ge type or types having Mg further added to the above, so they can be bonded even if not in a vacuum, enabling bonding with exceptional productivity. That is, the melting points of the Al—Si and Al—Ge types cannot be lowered without adding relatively large quantities of Si and Ge, but if too much is added, they will become hard and brittle. If, for example, the proportion of Si in an Al—Si alloy is lowered to 5% in order to avoid such problems, the melting point will be 615° C., making bonding difficult at temperatures below 620° C. even with pressure applied. On the other hand, Al—Cu—Mg alloys are capable of bonding at temperatures of about 600° C. by taking appropriate measures such as application of pressure, even if the proportion of Cu is lowered to about 4%, thus widening the tolerance for bonding conditions.

Next, in Al—Cu—Mg alloys, the Cu and Mg tends to evenly disperse in the Al as compared with Si or Ge, so localized melting is less likely to occur and excess bonding material will not tend to be squeezed out, enabling stable bonding in a relatively short time.

The Al—Cu—Mg alloy used may be an alloy of the three components Al, Cu and Mg, and may also contain other components. For example, aside from Al, Cu and Mg, it may contain components such as Zn, In, Mn, Cr, Ti, Bi, B and Fe in a total amount of 5 wt % or less.

The proportion of Cu in the Al—Cu—Mg alloy is preferably 2 to 6 wt %. At less than 2 wt %, the bonding temperature becomes high and too close to the melting point of Al, and at more than 6 wt %, the spread portion of the bonding material after bonding can become particularly hard, reducing the reliability of the circuit board. The proportion is preferably 1.5 to 5 wt %. On the other hand, regarding Mg, the bonding state can be made good by adding a small amount. This is believed to be due to the effects of removal of the oxide layer on the Al surface and effects of improving the wettability between the bonding material and the aluminum nitride substrate surface. The proportion of Mg is preferably 0.1 to 2 wt %. At less than 0.1 wt %, the effects of addition are not pronounced, and at more than 2 wt %, there is a detrimental effect on the hardness of the Al or Al alloy, as well as vaporizing in large amounts during bonding so as to cause problems in furnace operation. In particular, 0.3 to 1.5 wt % is preferred.

Examples of commercially available bonding materials that could be used include alloy 2018 containing about 4 wt % of Cu and about 0.5 wt % of Mg in Al, alloy 2017 containing about 0.5 wt % of Mn, and alloys 2001, 2005, 2007, 2014, 2024, 2030, 2034, 2036, 2048, 2090, 2117, 2124, 2214, 2218, 2224, 2324 and 7050.

As for the bonding temperature, a very wide range of 560 to 630° C. can be used, but the appropriate range will differ depending on the composition of the bonding material. If it contains low melting point components such as Zn or In, or a relatively high Cu or Mg content, then bonding is possible even at 600° C. or less. If the bonding temperature exceeds 630° C., brazing and soldering defects (a "worm-eaten" effect in the circuits) can occur during bonding.

During heat bonding, the plate surface of the substrate 1 consisting of an aluminum-graphite composite is preferably pressed from a perpendicular direction at 10 to 100 kgf/cm², particularly 15 to 80 kgf/cm². The method of applying pressure may be placement of weights, or by mechanical application using jigs. The pressure should be kept within the above range at least until reaching the temperature at which bonding begins, for example, when bonding with a 95.7% Al-4% Cu-0.3% Mg alloy foil at a temperature of 610° C., at least up to 580° C.

In the heat dissipating component, a metal circuit 3, for example, an Al circuit, is formed on one main surface and/or both main surfaces of the substrate 1 consisting of a plate-shaped aluminum-graphite composite. While the Al—Cu—Mg alloy bonding material may be interposed between the metal plate for forming the Al circuit, the Al circuit pattern constituting the metal circuit 3 and the substrate 1, it is convenient to clad them together before hand.

By using an Al—Cu—Mg alloy as the bonding agent for constituting the active metal bonding layer 7, the productivity of the heat dissipating component can be greatly improved. One reason is that bonding is not limited to vacuum furnaces. Vacuum furnaces are inherently expensive, difficult to make continuous, and have poor volume efficiency as batch furnaces. When made large, temperature distributions tend to occur, so production is not possible at high yields. In contrast, when an Al—Cu—Mg alloy is used instead of a conventional Al—Si or Al—Ge alloy bonding material, bonding is possible even if not in a vacuum, such as in a low-oxygen atmosphere of $N_2$, $H_2$, inert gas or a mixture thereof, enabling simple furnace structures and continuous structures. By making them continuous, the factors contributing to disparities in the product such as temperature distributions can be reduced, enabling production of products of stable quality with good yield.

When producing the heat dissipating component using a metal plate for forming an Al circuit as the element for forming the metal circuit 3, it is preferable to stack the metal plate for forming the Al circuit and a substrate 1 consisting of a plate-shaped aluminum-graphite composite so that they lie adjacent, and heat them. This is because the metal plate for forming the Al circuit has a higher coefficient of thermal expansion than an aluminum-graphite composite, so deformations wherein cooling after bonding results in the substrate 1 side consisting of the plate-shaped aluminum-graphite composite becoming convex are reduced. This takes advantage of the fact that Al is a material that is susceptible to plastic deformation, and spacers can be interposed as needed in order to avoid adhesion between the Al materials.

EXAMPLES

Examples 1 and 2

As Example 1, an isotropic graphite material (Tokai Carbon 6347) of bulk density 1.83 g/cm$^3$, and as Example 2, an isotropic graphite material (Tokai Carbon G458) of bulk density 1.89 g/cm$^3$, were worked to the shape of a rectangular parallelepiped of dimensions 200 mm×200 mm×250 mm, then sandwiched between iron plates of thickness 12 mm coated with a graphite mold release agent, and coupled with M10 nuts and bolts to form a stack. The resulting stack was preheated for 1 hour in an electric furnace with a nitrogen atmosphere at a temperature of 650° C., then placed in a preheated press mold of inner diameter 400 mm×height 300 mm, an aluminum alloy melt containing 12 mass % of silicon was poured in, and a pressure of 100 MPa was applied for 20 minutes to infiltrate the isotropic graphite material with the aluminum alloy. Next, after cooling to room temperature, the aluminum alloy and iron plate portions were cut with a wet band-type saw, resulting in a 200 mm×200 mm×250 mm aluminum-graphite composite. The resulting composite was annealed for 2 hours at a temperature of 500° C. to remove the residual stress from infiltration.

On the other hand, the respective isotropic graphite materials were ground to form a sample (3×3×20 mm) for use in measuring the coefficient of thermal expansion in three directions and a sample (23 mm×25 mm×1 mm) for use in measuring the thermal conductivity. The respective samples were used to measure the coefficient of thermal expansion at a temperature of 23° C. to 150° C. using a thermal expansion meter (Seiko TMA 300) and to measure the thermal conductivity at 25° C. by laser flash analysis (Rigaku LF/TCM-8510B). The results are shown in Table 1. The porosity of the isotropic graphite material was calculated from the bulk density measured by Archimedes' Law using graphite of ideal density 2.2 g/cm$^3$.

TABLE 1

| Bulk Density (g/cm$^3$) | Porosity (%) | Thermal Conductivity (W/mK) | | Coefficient of Thermal Expansion (×10$^{-6}$/K) | |
| --- | --- | --- | --- | --- | --- |
| | | average | max/min | average | max/min |
| Ex. 1 | 1.83 | 17 | 120 | 1.1 | 4.2 | 1.2 |
| Ex. 2 | 1.89 | 14 | 160 | 1.1 | 3.9 | 1.2 |

Note 1:
Average values of thermal conductivity and coefficient of thermal expansion are average values in three orthogonal directions.
Note 2:
Max/min of thermal conductivity and coefficient of thermal expansion are ratios of maximum to minimum values in three orthogonal directions.

Next, the resulting aluminum-graphite composites were ground to form a sample (3×3×20 mm) for use in measuring the coefficient of thermal expansion in three directions, a sample (25 mm×25 mm×1 mm) for use in measuring the thermal conductivity and a sample (3 mm×4 mm×40 mm) for testing strength. The respective samples were used to measure the coefficient of thermal expansion at a temperature of 25° C. to 150° C. using a thermal expansion meter (Seiko TMA 300), the thermal conductivity at 25° C. by laser flash analysis (Rigaku LF/TCM-8510B) and the three-point bending strength (in compliance with JIS-R1601). The bulk density of the samples was measured by Archimedes' Law to calculate the rate of infiltration of the voids in the isotropic graphite material.

TABLE 2

| | Bulk Density (g/cm$^3$) | Infiltration Rate (%) | Bending Strength (MPa) | Thermal Conductivity (W/mK) | | Coefficient of Thermal Expansion (×10$^{-6}$/K) | |
| --- | --- | --- | --- | --- | --- | --- | --- |
| | | | | average | max/min | average | max/min |
| Ex. 1 | 2.21 | 81 | 80 | 185 | 1.1 | 7.4 | 1.1 |
| Ex. 2 | 2.22 | 85 | 85 | 205 | 1.1 | 4.5 | 1.1 |

Note 1:
Average values of thermal conductivity and coefficient of thermal expansion are average values in three orthogonal directions.
Note 2:
Max/min of thermal conductivity and coefficient of thermal expansion are ratios of maximum to minimum values in three orthogonal directions.

Next, the resulting 200 mm×200 mm×250 mm aluminum-graphite composites were anchored and cut under the conditions indicated in Table 3 using a multi-wire saw (Takatori MWS-612SD) having electrodeposition type wires of width 0.20 mm arranged at intervals of 1.5 mm so as to form cross sections parallel to the 200 mm×200 mm faces of the aluminum-graphite composites. The cutting reserve (cut width) was 0.3 mm in all cases. The thicknesses of the resulting plate-shaped aluminum-graphite composites were measured using calipers, and the surface roughnesses (Ra) of the cut faces were measured using a surface roughness meter. The results are shown in Table 3.

TABLE 3

| | Processing Conditions | | | | Composite Measurements | |
| --- | --- | --- | --- | --- | --- | --- |
| | Abrasive Grains | | Feed Rate | Cut Rate | Plate Thickness | Ra |
| | type | avg size | (m/min) | (mm/min) | (mm/min) | (μm) |
| Ex. 1 | diamond | 50 μm | 400 | 0.6 | 1.2 | 0.6 |
| Ex. 2 | diamond | 50 μm | 400 | 0.6 | 1.2 | 0.6 |

LED Light Emitting Element Production Example (1) 100 parts by mass of bisphenol F-type epoxy resin (Epicoat 807, epoxy equivalent=173, Yuka Shell Epoxy) as an epoxy resin, 5 parts by mass of the silane coupler γ-glycidoxypropylmethyldiethoxysilane (AZ-6165, Nippon Unicar) and 500 parts by mass of alumina of average grain size 5 μm (AS-50, Showa Denko) as an inorganic filler were mixed together in a general-purpose mixer/stirrer, and as curing agents, 25 parts by mass of polyoxypropylene amine (Jeffamine D-400, Texaco Chemicals) and 20 parts by mass of polyoxypropylene amine (Jeffamine D2000, Texaco Chemicals) were added and mixed.

(2) The above mixture was applied to the above-described plate-shaped aluminum-graphite composite so that the thickness of the insulating adhesive layer after curing was 100 μm, preheated to the B-stage state, an electrolytic copper foil was bonded to a thickness of 35 μm using a laminator, and then after-cure treatments were performed at 80° C.×2 hrs and 150° C.×3 hrs to produce a composite with insulating adhesive layer and copper foil. Furthermore, the copper foil was etched to form a desired circuit having a pad portion, resulting in an aluminum-graphite composite circuit substrate. Next, a white solder resist (PSR4000-LEW1, Taiyo Ink) was applied via a screen onto a specific circuit, then UV-cured. Then, a non-insulated LED chip (1 mm²) was adhered by Ag paste to a portion having electrolytic copper foil exposed, resulting in an LED light emitting element as shown in FIG. 1. Additionally, a portion having the insulating layer exposed at a desired location was removed by a $CO_2$ laser, then an insulated LED chip (1 mm²) was adhered to that portion by an Ag paste, resulting in an LED light emitting element as shown in FIG. 3.

Example 3

Led Light Emitting Element Production Example (1) The plate-shaped aluminum-graphite composite of Example 1 was electroplated to form a copper layer 35 μm thick on one entire surface of the composite, then the copper layer other than at the desired portions was removed by etching to form an aluminum-graphite composite having copper bumps. On the other hand, 100 parts by mass of bisphenol F-type epoxy resin (Epicoat 807, epoxy equivalent=173, Yuka Shell Epoxy) as an epoxy resin, 5 parts by mass of the silane coupler γ-glycidoxypropylmethyl diethoxysilane (AZ-6165, Nippon Unicar) and 500 parts by mass of alumina of average grain size 5 μm (AS-50, Showa Denko) as an inorganic filler were mixed together in a general-purpose mixer/stirrer, and as a curing agent, 45 parts by mass of polyoxypropylene amine (Jeffamine D-400, Texaco Chemicals) was added and mixed. This as applied to the 35 μm-thick copper foil to a thickness of 100 μm and put into the B-stage state to prepare a copper foil with resin.
(2) The aforementioned aluminum-graphite composite with copper bumps and copper foil with resin were stacked and heat pressed at 180° C. to integrate, then the copper foil at the convex portions above the copper bumps were removed by etched. Thereafter, the insulating layer (cured portions of the B-stage sheets) were removed by a $CO_2$ laser, to form an aluminum-graphite composite circuit board with structured copper bumps. Next, a white solder resist (PSR4000-LEW1, Taiyo Ink) was applied via a screen onto a specific circuit, then UV-cured. Then, a non-insulated LED chip (1 mm²) was adhered by Ag paste to a portion having electrolytic copper foil exposed, resulting in an LED light emitting element as shown in FIG. 1. The insulating layer residues were removed from the surface of the circuits on the copper bumps using #200 polishing paper, then the surface was smoothly finished using #800 polishing paper. An insulated LED chip (1 mm²) was adhered to the surface by an Ag paste, resulting in an LED light emitting element as shown in FIG. 2.

Example 4

Led Light Emitting Element Production Example

The plate-shaped aluminum-graphite composite obtained in Example 1, a bonding material consisting of an alloy composed of 95% Al-4% Cu-1% Mg and having a thickness of 0.3 mm, and a 0.4 mm thick Al circuit were stacked in that order to form a single set, and ten sets were stacked with spacers placed in between. These were heated for ten minutes at 610° C. in a vacuum (batch furnace) of $4 \times 10^{-3}$ Pa while applying pressure at 500 MPa in the direction perpendicular to the substrate surface consisting of an aluminum-graphite composite from outside the furnace using a hydraulic uniaxial press device via a carbon push rod, thereby bonding them together, to form an aluminum-graphite composite circuit board. Next, a white solder resist (PSR4000-LEW1, Taiyo Ink) was applied via a screen onto a specific circuit, then UV-cured. Furthermore, an insulated LED chip (1 mm²) was adhered over the electrolytic copper foil exposed portion by an Ag paste, resulting in an LED light emitting element as shown in FIG. 1.

Examples 5-19 and Comparative Examples 1-3

Next, the resulting 200 mm×200 mm×250 mm aluminum-graphite composite of Example 1 was anchored and cut under the conditions indicated in Table 4 using a multi-wire saw (Takatori MWS-612SD) so as to form cross sections parallel to the 200 mm×200 mm faces of the aluminum-graphite composites. The thicknesses and surface roughnesses (Ra) of the resulting plate-shaped aluminum-graphite composites are shown in Table 5. Regarding Comparative Example 1, the wires repeatedly ruptured during the cutting step, so plate-shaped aluminum-graphite composites were not able to be obtained.

TABLE 4

| | Abrasive Grains | | Feed Rate (m/min) | Cut Rate (mm/min) | Wire Size (mm) | Wire Spacing (mm) |
|---|---|---|---|---|---|---|
| | type | avg size | | | | |
| Ex. 5 | diamond | 50 μm | 700 | 0.5 | 0.2 | 1.5 |
| Ex. 6 | diamond | 50 μm | 100 | 0.5 | 0.2 | 1.5 |
| Ex. 7 | diamond | 50 μm | 400 | 2 | 0.2 | 1.5 |
| Ex. 8 | diamond | 50 μm | 400 | 0.1 | 0.2 | 1.5 |
| Ex. 9 | diamond | 50 μm | 400 | 1 | 0.2 | 1.5 |
| Ex. 10 | diamond | 50 μm | 200 | 0.1 | 0.2 | 1.5 |
| Ex. 11 | diamond | 50 μm | 400 | 0.5 | 0.1 | 1.5 |
| Ex. 12 | diamond | 50 μm | 400 | 0.5 | 0.3 | 2 |
| Ex. 13 | diamond | 50 μm | 400 | 0.5 | 0.2 | 0.8 |
| Ex. 14 | diamond | 50 μm | 400 | 0.5 | 0.2 | 3.3 |
| Ex. 15 | diamond | 100 μm | 400 | 0.5 | 0.2 | 1.5 |
| Ex. 16 | diamond | 10 μm | 400 | 0.5 | 0.2 | 1.5 |
| Ex. 17 | C-BN | 50 μm | 400 | 0.5 | 0.2 | 1.5 |
| Ex. 18 | silicon carbide | 50 μm | 400 | 0.5 | 0.2 | 1.5 |
| Ex. 19 | alumina | 50 μm | 400 | 0.5 | 0.2 | 1.5 |
| Co. Ex. 1 | diamond | 2 μm | 400 | 0.05 | 0.2 | 1.5 |
| Co. Ex. 2 | diamond | 200 μm | 1000 | 2 | 0.3 | 2 |
| Co. Ex. 3 | diamond | 200 μm | 700 | 2 | 0.3 | 2 |

TABLE 5

| | Plate Thickness (mm) | Surface Roughness (Ra) (μm) |
|---|---|---|
| Ex. 5 | 1.2 | 0.5 |
| Ex. 6 | 1.2 | 1 |
| Ex. 7 | 1.2 | 2 |
| Ex. 8 | 1.2 | 0.3 |
| Ex. 9 | 1.2 | 1.2 |
| Ex. 10 | 1.2 | 0.5 |
| Ex. 11 | 1.3 | 0.4 |
| Ex. 12 | 1.4 | 0.6 |
| Ex. 13 | 0.5 | 0.7 |
| Ex. 14 | 3 | 0.6 |
| Ex. 15 | 1.2 | 1.1 |
| Ex. 16 | 1.2 | 0.3 |
| Ex. 17 | 1.2 | 0.7 |
| Ex. 18 | 1.2 | 0.7 |
| Ex. 19 | 1.2 | 0.6 |
| Co. Ex. 1 | — | — |

TABLE 5-continued

| | Plate Thickness (mm) | Surface Roughness (Ra) (μm) |
|---|---|---|
| Co. Ex. 2 | 0.7 | 3.5 |
| Co. Ex. 3 | 0.8 | 3.2 |

Examples 20-26, Comparative Example 4

The isotropic graphite materials (Examples 20-26) and the extruded graphite material (Comparative Example 4) shown in Table 6 were worked into the shape of a 200 mm×250 mm×150 mm rectangular parallelepiped to produce an aluminum-graphite composite in the same manner as Example 1. The resulting aluminum-graphite composites were subjected to property evaluations in the same manner as Example 1. The results are shown in Table 7.

TABLE 6

| | Bulk Density (g/cm³) | Porosity (%) | Thermal Conductivity (W/mK) | | Coefficient of Thermal Expansion (×10⁻⁶/K) | |
|---|---|---|---|---|---|---|
| | | | average | max/min | average | max/min |
| Ex. 20 | 1.76 | 20 | 115 | 1.2 | 4.5 | 1.2 |
| Ex. 21 | 1.98 | 10 | 110 | 1.1 | 3 | 1.1 |
| Ex. 22 | 1.78 | 19 | 100 | 1.1 | 4 | 1.1 |
| Ex. 23 | 1.83 | 17 | 200 | 1.1 | 2 | 1.3 |
| Ex. 24 | 1.89 | 14 | 130 | 1.3 | 3.5 | 1.2 |
| Ex. 25 | 1.96 | 11 | 110 | 1.1 | 2.5 | 1.2 |
| Ex. 26 | 1.83 | 17 | 100 | 1.1 | 4.9 | 1.2 |
| Co. Ex. 4 | 1.76 | 20 | 160 | 1.7 | 4.7 | 1.6 |

Note 1:
Average values of thermal conductivity and coefficient of thermal expansion are average values in three orthogonal directions.
Note 2:
Max/min of thermal conductivity and coefficient of thermal expansion are ratios of maximum to minimum values in three orthogonal directions.

TABLE 7

| | Bulk Density (g/cm³) | Infiltration Rate (%) | Bending Strength (MPa) | Thermal Conductivity (W/mK) | | Coefficient of Thermal Expansion (×10⁻⁶/K) | |
|---|---|---|---|---|---|---|---|
| | | | | average | max/min | average | max/min |
| Ex. 20 | 2.23 | 85 | 80 | 155 | 1.1 | 7.4 | 1.1 |
| Ex. 21 | 2.20 | 78 | 95 | 175 | 1.2 | 6.1 | 1.1 |
| Ex. 22 | 2.22 | 83 | 75 | 165 | 1.2 | 6.3 | 1.2 |
| Ex. 23 | 2.23 | 86 | 60 | 255 | 1.05 | 5.4 | 1.1 |
| Ex. 24 | 2.22 | 85 | 90 | 195 | 1.05 | 6.7 | 1.1 |
| Ex. 25 | 2.21 | 82 | 135 | 150 | 1.1 | 5.8 | 1.1 |
| Ex. 26 | 2.20 | 79 | 105 | 190 | 1.05 | 7.5 | 1.1 |
| Co. Ex. 4 | 2.24 | 87 | 25 | 260 | 1.7 | 7.9 | 1.6 |

Note 1:
Average values of thermal conductivity and coefficient of thermal expansion are average values in three orthogonal directions.
Note 2:
Max/min of thermal conductivity and coefficient of thermal expansion are ratios of maximum to minimum values in three orthogonal directions.

Examples 27-33 and Comparative Example 5

The isotropic graphite materials of 200 mm×200 mm×250 mm used in Example 1 were sandwiched between iron plates of thickness 12 mm coated with a graphite mold release agent, and coupled with M10 nuts and bolts to form a stack. The resulting stack was subjected to the same treatment as Example 1 aside from the conditions shown in Table 8, to infiltrate the isotropic graphite materials with an aluminum alloy, resulting in aluminum-graphite composites. The resulting composites were annealed for 2 hours at a temperature of 500° C. to remove the residual stress from infiltration, then evaluated in the same manner as Example 1. The results are shown in Table 9.

TABLE 8

| | Aluminum Alloy | Preheat Atmosphere | Preheat Temperature (° C.) | Infiltration Pressure (MPa) |
|---|---|---|---|---|
| Ex. 27 | Al—12% Si | Air | 650 | 100 |
| Ex. 28 | Al—12% Si | Nitrogen | 650 | 20 |
| Ex. 29 | Al—12% Si | Nitrogen | 650 | 50 |
| Ex. 30 | Al—12% Si | Nitrogen | 600 | 100 |
| Ex. 31 | Al—3% Si | Nitrogen | 750 | 100 |
| Ex. 32 | Al—20% Si | Nitrogen | 650 | 100 |
| Ex. 33 | Al—12% Si—3% Mg | Nitrogen | 650 | 100 |
| Co. Ex. 5 | Al—12% Si | Nitrogen | 650 | 5 |

TABLE 9

| | Bulk Density (g/cm³) | Infiltration Rate (%) | Bending Strength (MPa) | Thermal Conductivity (W/mK) | | Coefficient of Thermal Expansion (×10⁻⁶/K) | |
|---|---|---|---|---|---|---|---|
| | | | | average | max/min | average | max/min |
| Ex. 27 | 2.22 | 84 | 80 | 180 | 1.1 | 7.4 | 1.1 |
| Ex. 28 | 2.20 | 79 | 75 | 170 | 1.1 | 7.2 | 1.1 |
| Ex. 29 | 2.21 | 81 | 80 | 175 | 1.1 | 7.3 | 1.1 |
| Ex. 30 | 2.21 | 81 | 75 | 175 | 1.1 | 7.3 | 1.1 |
| Ex. 31 | 2.22 | 84 | 85 | 180 | 1.1 | 7.4 | 1.2 |
| Ex. 32 | 2.23 | 86 | 90 | 170 | 1.1 | 6.9 | 1.1 |
| Ex. 33 | 2.22 | 84 | 80 | 180 | 1.1 | 7.3 | 1.1 |
| Co. Ex. 5 | 2.16 | 68 | 70 | 140 | 1.1 | 7.0 | 1.1 |

Example 34

The material of Example 2 was cut into a plate-shaped aluminum-graphite composite of thickness 6 mm using a multi-wire saw in the same manner as Example 2 aside from the fact that the wire spacing was 6.3 mm. The resulting aluminum-graphite composite was worked to shape one face into fins of width 2 mm and height 5 mm spaced at intervals of 5 mm using a hard metal end mill in a machining center.

Using the same technique as Example 1, a non-insulated LED chip was bonded to the face on which the fins were not formed to obtain an LED light emitting element of the structure shown in FIG. 1. Additionally, an insulated LED chip (1 mm²) was bonded by an Ag paste to obtain an LED light emitting element of the structure shown in FIG. 3.

Examples 35 and 36

The plate-shaped aluminum-graphite composite (200 mm×200 mm×1.2 mm) of Example 1 was ultrasonically cleaned using water, then electroless Ni—P plated to a thickness of 3 μm. In Example 35, the electroless Ni—P plating was followed by a electroless Ni—B plating to a thickness of 1 μm, and in Example 36, the electroless Ni—P plating was followed by a electroless Au plating to a thickness of 1 μm, to form plating layers on the surfaces of the aluminum-graphite composites. The resulting plated products were of good quality, with no pin holes apparent to the naked eye. Additionally, after coating the plating surfaces with flux, they were immersed in a lead/tin eutectic solder. Over 99% of the plating surface was wetted with solder.

Using the same technique as Example 3, an insulated LED chip (1 mm$^2$) was bonded by Ag paste to obtain an LED light emitting element of the structure shown in FIG. 2.

The invention claimed is:

1. A method of producing an LED light emitting element, comprising:
   (a) infiltrating, by squeeze casting, an aluminum alloy comprising 3 to 20 mass % of silicon into an isotropic graphite material to obtain an aluminum-graphite composite, the isotropic graphite material having a graphitized coke with a porosity of 10 to 20 vol % as a raw material, the aluminum-graphite composite having a surface roughness (Ra) of 0.1 to 3 μm, a thermal conductivity of 150 to 300 W/mK at a temperature of 25° C., a maximum/minimum ratio of 1 to 1.3 for the thermal conductivity in three orthogonal directions, a coefficient of thermal expansion of $4\times10^{-6}$ to $7.5\times10^{-6}$/K at a temperature of 25° C. to 150° C., a maximum/minimum ratio of 1 to 1.3 for said coefficient of thermal expansion in three orthogonal directions, and a three-point bending strength of 50 to 150 MPa;
   (b) cutting said aluminum-graphite composite using a multi-wire saw, under the following conditions (1) to (4):
   (1) the wires of said multi-wire saw having bonded abrasive grains made of diamond, C—BN, silicon carbide, alumina, or a combination thereof; and having an average grain size of 10 to 100 μm;
   (2) said wires having a wire diameter of 0.1 to 0.3 mm;
   (3) a wire delivery of said wires being 100 to 700 m/min; and
   (4) a cutting rate by said wires is 0.1 to 2 mm/min;
   to form a substrate with a thickness of 0.5 to 3 mm; and
   (c) mounting an LED-bearing chip and/or an LED package on one main surface of said substrate to produce the LED light emitting element.

2. The method according to claim 1, further comprising working one main surface of said substrate into a shape of a fin.

3. The method according to claim 1, further comprising forming holes in said substrate.

4. The method according to claim 1, further comprising forming a plating layer on a surface of said substrate.

5. The method according to claim 1, further comprising forming a metal circuit on one main surface or both main surfaces of said substrate with an insulation layer interposed there between.

6. The method according to claim 1, further comprising forming a metal circuit on one main surface or both main surfaces of said substrate with an active metal bonding agent layer interposed there between.

7. The method according to claim 1, wherein the aluminum-graphite composite has a surface roughness (Ra) of 0.1 to 2 μm.

8. The method according to claim 1, wherein the substrate has a thickness of 1 to 2 mm.

9. An LED light emitting element produced by the method of claim 1.

10. A method of producing an LED light emitting element, comprising:
    (a) infiltrating, by squeeze casting, an aluminum alloy comprising 3 to 20 mass % of silicon into an isotropic graphite material to obtain an aluminum-graphite composite, the isotropic graphite material having a graphitized coke with a porosity of 10 to 20 vol % as a raw material, the aluminum-graphite composite having a surface roughness (Ra) of 0.1 to 3 μm, a thermal conductivity of 150 to 300 W/mK at a temperature of 25° C., a maximum/minimum ratio of 1 to 1.3 for the thermal conductivity in three orthogonal directions, a coefficient of thermal expansion of $4\times10^{-6}$ to $7.5\times10^{-6}$/K at a temperature of 25° C. to 150° C., a maximum/minimum ratio of 1 to 1.3 for said coefficient of thermal expansion in three orthogonal directions, and a three-point bending strength of 50 to 150 MPa;
    (b) cutting said aluminum-graphite composite using a multi-wire saw, under the following conditions (1) to (4):
    (1) the wires of said multi-wire saw having bonded abrasive grains made of diamond, C—BN, silicon carbide, alumina, or a combination thereof; and having an average grain size of 10 to 100 μm;
    (2) said wires having a wire diameter of 0.1 to 0.3 mm;
    (3) a wire delivery of said wires being 100 to 700 m/min; and
    (4) a cutting rate by said wires is 0.1 to 2 mm/min;
    to form a substrate with a thickness of 0.5 to 3 mm; and
    (c) mounting an LED-bearing chip and/or an LED package on both main surfaces of said substrate to produce the LED light emitting element.

* * * * *